United States Patent [19]

Behfar-Rad et al.

[11] Patent Number: 4,924,476
[45] Date of Patent: May 8, 1990

[54] TRAVELING WAVE SEMI-CONDUCTOR LASER

[75] Inventors: Abbas Behfar-Rad; S. Simon Wong, both of Ithaca, N.Y.

[73] Assignee: Cornell Research Foundation, Inc., Ithaca, N.Y.

[21] Appl. No.: 129,024

[22] Filed: Dec. 4, 1987

[51] Int. Cl.$^5$ .............................................. H01S 3/083
[52] U.S. Cl. ...................................... 372/94; 372/50; 372/92
[58] Field of Search .................. 372/43, 50, 92, 94

[56] References Cited

U.S. PATENT DOCUMENTS

| 3,248,671 | 11/1962 | Dill | 372/93 |
| 3,521,192 | 8/1967 | De Maria et al. | 372/25 |
| 3,530,397 | 9/1970 | Suzuki et al. | 372/66 |
| 3,538,453 | 11/1970 | Miller | 372/108 |
| 4,097,819 | 6/1978 | Bellavance | 372/50 |
| 4,578,793 | 3/1986 | Kane et al. | 372/94 |
| 4,580,269 | 4/1986 | Salour et al. | 372/43 |

FOREIGN PATENT DOCUMENTS 0066181  4/1984  Japan ................................. 372/50

Primary Examiner—William L. Sikes
Assistant Examiner—Georgia Y. Epps
Attorney, Agent, or Firm—Jones, Tullar & Cooper

[57] ABSTRACT

A triangular ring laser utilizing total internal reflection at two angled facets and a preselected amount of reflection at a third angled facet is disclosed. Partial transmission occurs through the third facet to reduce the threshold current required for achieving stimulated emission. The facets are at three corners of the triangular laser, and are formed by chemically assisted ion beam etching in which SiO$_2$ is used as a mask, whereby smooth vertical walls are produced to form facets having reflective characteristics equivalent to those formed by cleaving.

9 Claims, 2 Drawing Sheets

FIG. 4C (REACTIVE ION ETCHING)

FIG. 4D (CHEMICALLY ASSISTED ION BEAM ETCHING)

TRAVELING WAVE SEMI-CONDUCTOR LASER

The present invention relates, in general, to a travelling wave semiconductor laser, and more particularly to a ring-type laser utilizing three non-parallel facets, two of which are totally reflective and the third of which receives optical radiation at an angle between that of the critical angle of the facet and an angle perpendicular to the facet surface, or 0°, whereby the reflectivity of the third facet is selectable. The invention further relates to a method of forming facets at the required angles to obtain travelling wave operation, and in particular relates to a reactive ion etching process forming a silicon dioxide mask which is used in a chemically assisted ion beam etching process to etch GaAs—AlGaAs structures.

Semiconductor lasers, such as p-n junction lasers typically utilize a semiconductor material such as gallium arsenide (GaAs). Typically, a GaAs p-n junction laser is in the form of a solid state Fabry-Perot resonant cavity having parallel, semi-reflective end faces, or facets. The other set of faces on the cavity are roughened to suppress light energy in any modes except the mode propogating between the end faces. Such devices have been fabricated using a starting material which is an n-type GaAs wafer doped with silicon. A p-type layer is grown on the wafer, for example, by the liquid-phase epitaxial process. The wafer is lapped to a thickness of 75 microns, and the top and bottom surfaces are metallized. The wafer is then cleaved into bars 300 to 500 micrometers wide, producing cleaved facets at opposite ends of the bars. The junction between the n-type and p-type layers forms the active region of the laser. A bias voltage is connected across the wafer by means of the metallization on the upper and lower surfaces, with a strong forward bias voltage serving to stimulate transitions between energy states within the semiconductor material. The junction region behaves in a manner somewhat analogous to a resonant cavity, with stimulated emission causing light to propagate along the length of the device. A significant portion of this light emerges from the cleaved ends of the device.

The partially reflective facets ends of the semiconductor rectangular laser are formed by cleaving the wafer, and because this operation relies upon the crystalline structure of the semiconductor material, the exact location and angle of the mirror surface produceable by cleaving is limited. The cleaved facets produce a fixed reflectivity for the rectangular semiconductor laser, which results in a relatively high threshold current for lasing. In addition, the formation of a reflective end by cleaving is incompatible with semiconductor lasers formed by monolithic integration.

It has been found desirable to produce semiconductor laser devices in such a way as to allow control of the reflectivity of the light-emitting end of the device so as reduce the threshold of current required for lasing operation. Furthermore, it has been found desirable to develop a method for forming the reflective ends of a semiconductor laser in a way that is compatible with monolithic integration techniques, without increasing the threshold current for lasing in such devices over that available through the use of cleaved semiconductor laser devices. In addition, it has been found desirable to provide a method of forming semiconductor lasers and particularly the reflective facets of such devices, in such a way as to control the reflectivity and transmissivity of the end of the laser, and thereby to control the threshold of current at which lasing action occurs.

SUMMARY OF THE INVENTION

It is, therefore, an object of the present invention to provide an improved semiconductor travelling wave laser in which the reflectivity of the laser facets can be selected.

It is a further object of the invention to provide a method of producing a smooth, mirror-like end surface, or facet, on a semiconductor laser through an etching process which permits a greater control of the facet surface than is possible with cleaving techniques or with prior etching processes.

The uncoated facets of a semiconductor laser transmits a large percentage of the incident light which is perpendicular to its surface. Accordingly, in the typical rectangular resonant cavity semiconductor laser in which the stimulated emission occurs between opposite parallel ends of the device, a relatively large current is required to initiate laser action because of the high transmission through the ends. Light striking the interior surface of the facets at an angle below the critical angle is partially reflected and partially transmitted, with reflection increasing as the angle away from perpendicular increases, until the critical angle is reached at which light is transmitted along the facet. Above the critical angle, all of the incident light is internally reflected.

In accordance with the present invention, a semiconductor laser structure is provided which enables the designer to select the angles at which incident light propagating in the laser strikes the facets of the laser. Consequently, the designer selects the relative amount of light that emerges and the amount that is internally reflected, so that the threshold current required to initiate laser action can be selectively reduced. The structure of the present invention departs from the typical rectangular resonant cavity structure, and instead provides a ring-type laser having at least three facets which produce a travelling wave of light within the laser. The travelling wave strikes the emergent facet at a predetermined angle, which is less than the critical angle, to thereby transmit a corresponding percentage of the incident light while reflecting the remaining portion of the light. This allows laser action to occur at a lower threshold current as a smaller proportion of the internally stimulated light is transmitted at the emergence facet than would occur if the light impinged perpendicularly on the emergent facet, thereby reducing the current level required to achieve the threshold of laser operation.

The travelling wave is provided, in accordance with the present invention, by a laser structure which has a generally triangular cavity so that light energy propagates along a triangular path having three apexes, or ends. Two of the ends incorporate facets which receive light at an angle greater than the critical angle so that they are fully internally reflective. The third apex includes a facet which receives light at a preselected angle less than the critical angle so that a corresponding proportion of the laser light is internally reflected, and a corresponding percentage of the incident light is transmitted. The angular relationship of the three facets is selected by the laser designer in accordance with the desired laser light output and the desired threshold current for achieving stimulated emission.

In the present invention, the angle at which the several facets are positioned with respect to the direction of travel of the light within the laser body may coincide with the crystalline structure along which the semiconductor material can be cleaved to form facets. Furthermore, it is highly desirable to be able to form such a laser through the use of integrated monolithic techniques, wherein cleaving is not possible. Therefore, in accordance with another aspect of the present invention, the facet surfaces are formed not by cleaving, but by etching.

Although there have been previous attempts to produce laser facets by etching, such attempts have generally been unsuccessful and have resulted in inferior facets as compared to those obtainable by cleaving. In accordance with the invention, a process for obtaining etched facets which are as good as cleaved facets is provided through the use of chemically assisted ion beam etching (CAIBE). In this process, a layer of silicon dioxide ($SiO_2$) is deposited on the surface of the laser structure. A photoresist layer is then spun onto the surface of the silicon dioxide, and a contrast enhanced material (CEM) is spun onto the top of the photoresist. Conventional photolithographic techniques are used to pattern the photoresist material and thereafter reactive ion etching is employed to etch the silicon dioxide in the pattern of the photoresist material. After removing the photoresist layer, CAIBE is used to etch through the laser structure. It has been found that a vertical, extremely smooth etching of the laser structure is accomplished by this process to thereby provide a mirror-like end surface, or facet, on the laser which has reflectivity characteristics the equal of cleaved facets, but which does not have the limitations of cleaving.

BRIEF DESCRIPTION OF THE DRAWINGS

The foregoing and additional objects, features and advantages of the present invention will become apparent to those of skill in the art from the following detailed description of the invention, taken with the accompanying drawings, in which:

FIGS. 4A, 4B, 4C and 4D illustrate the method of producing etched facets for the laser of FIG. 2.

DESCRIPTION OF PREFERRED EMBODIMENTS

Figure 1:
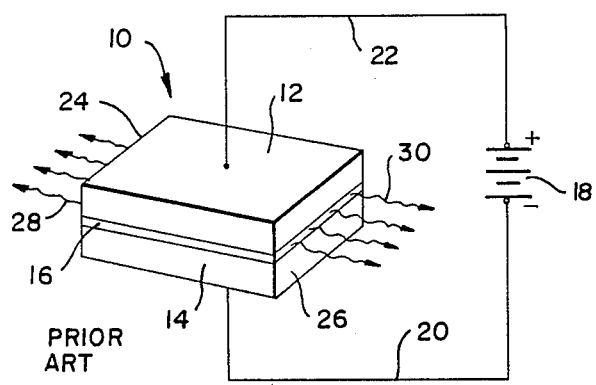
FIG. 1 is a diagrammatic illustration of a conventional, prior art gallium arsenide laser.

As illustrated in FIG. 1, a semiconductor laser 10 may be made by forming a junction between a p layer 12 and an n layer 14 in the same host lattice so as to form a p-n junction which acts as an active layer 16 in the laser. The doping of the materials is extremely heavy. A voltage from a bias source 18 is applied to the junction so that the n-type region is connected to a negative supply, as by way of line 20, and the p-type region is connected to a positive supply, by way of line 22, to forward bias the junction. As the forward bias is increased, photons are emitted within the active region 16 and by passing extremely high currents through the junction and polishing or cleaving to form the end faces 24 and 26 so that they act as partially reflective mirrors, laser action is obtained. The side walls of the device are roughened to prevent lasing in unwanted directions within the device so that light propagates longitudinally and emerges only from the ends 24 and 26, as indicated by arrows 28 and 30. The materials used for the laser device 10 may be gallium arsenide, although numerous other materials are suitable for making p-n junction lasers.

One cause of losses in p-n junction lasers is the narrow emitting area which causes laser light to be widely diverged into regions of the semiconductor where population inversion has not been sufficiently high for lasing. Consequently, this radiation is absorbed and the output diminished. This problem has been alleviated by developing so-called heterostructure lasers in which a material of differing reflective index is placed close by and parallel to the plane of the junction. Such a structure significantly reduces the threshold currents required to produce lasing action. In a gallium arsenide laser, the added material is gallium aluminum arsenide (AlGaAs) deposited on the p side of the junction by vapor deposition to produce a single heterostructure laser. By carrying out a similar operation on the n-type material as well, a double heterostructure device is produced, with further improvement being obtained. Still lower threshold currents have been obtained using graded index separate confinement heterostructure single quantum well (GRINSCH-SQW) devices.

Figure 2:
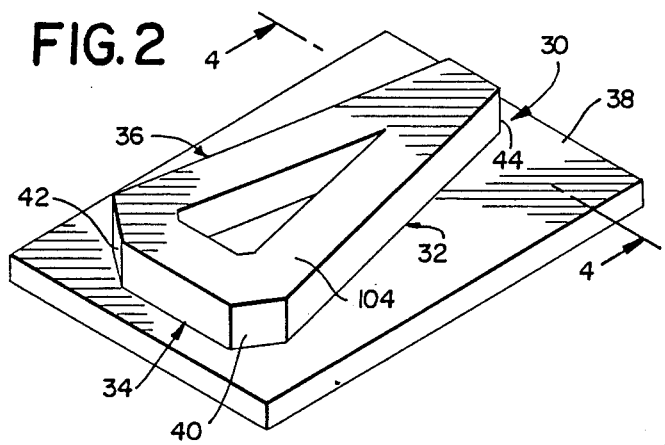
FIG. 2 is a diagrammatic perspective view of a monolithic nonrectangular laser constructed in accordance with the present invention.

A further reduction in threshold current is obtained, in accordance with the present invention, by means of a ring-type laser having at least two internally reflecting facets and at least one partially transmitting facet which serves as an emergence region for the laser light. Such a laser is illustrated in FIG. 2 as a triangular ring laser 30 which includes three cavity sections 32, 34 and 36 interconnected to form a triangular cavity. As illustrated, the laser 30 preferably is formed as a monolithic structure on a substrate 38. It may take various other shapes, if desired, although the triangular form is preferred. The upper surface of the laser may be coated with metal in conventional manner to provide a contact for applying a bias voltage across the device as illustrated in FIG. 1, with the opposite surface of the laser also being in contact with the bias source through a suitable contact. Application of current through the laser device produces lasing action within the body of the laser 30, creating optical travelling waves within the three sections 32, 34 and 36. In the triangular laser, the three apexes of the triangular cavity incorporate facets such as those illustrated at 40, 42 and 44. The surfaces of these facets are optically smooth, with facets 40 and 42 providing total internal reflection and facet 44 providing partial transmission to permit emergence of light.

Figure 3A:
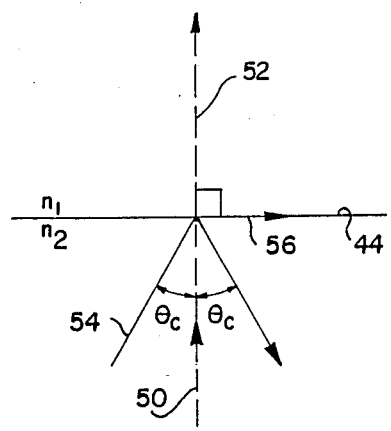
FIGS. 3A and 3B are graphical illustrations of the critical angle of light incident on a facet of the laser of FIG. 2.
Figure 3B:
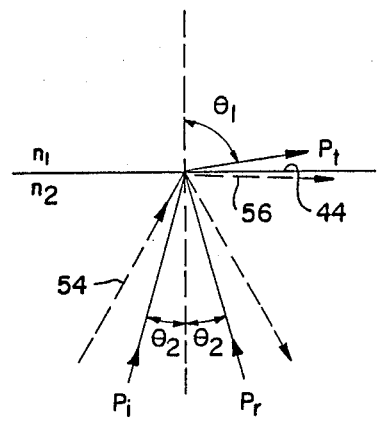

As illustrated in FIGS. 3A and 3B, a reflective surface such as facet 44 will transmit a substantial portion of the light energy which strikes it at an angle perpendicular to the surface of the facet. Thus, light impinging on surface 44 in the direction of arrow 50 will be partially reflected directly back along the path of the arrow, but a large percentage of the light energy will pass through the facet to emerge from the laser, as indicated by arrow 52. However, light impinging on the surface of the facet at an angle away from the perpendicular, such as the angle $\theta_2$ (FIG. 3B), will have a larger portion of its energy reflected and will provide a lower amount of emergent light. At a certain transition angle, which will depend upon the refraction indices of the materials on opposite sides of the facet 44, the incident light will travel along the facet, as indicated by arrows 54 and 56 (FIG. 3A). The angle at which this occurs is the critical angle $\theta_c$. Light striking the surface 44 at an angle greater than the critical angle will be totally reflected. Varying the angle of impingement of the light from the perpendicular to the critical angle will vary the amount of emergent light from a maximum value to zero, thereby providing a design parameter for the triangular laser 30 that will permit control of the amount of light which emerges from the facet 44. At the same time, the amount of light reflected internally and travelling around the cavity of the ring laser is determined. Since the amount of internally reflected light in part determines the threshold current required for producing the lasing action in laser 30, the angle of incidence of light travelling in the laser provides a controllable parameter for regulating and reducing the threshold current required for achieving stimulated emission.

As illustrated in FIG. 3B, incident light energy, or power, $P_i$ striking the surface 44 at an angle $\theta_2$ less than the critical angle will have a component $P_r$ reflected internally, and a component $P_t$ which will emerge through the reflective facet at an angle $\theta_1$, the relationship between these components may be expressed as follows:

$$P_i = P_t + P_r \qquad \text{(Eq. 1)}$$

$$\frac{P_r}{P_i} = \left( \frac{n_2 \cos\theta_2 - n_1 \cos\theta_1}{n_2 \cos\theta_2 + n_1 \cos\theta_1} \right)^2 \qquad \text{(Eq. 2)}$$

$$n_2 \sin\theta_2 = n_1 \sin\theta_1 \qquad \text{(Eq. 3)}$$

where:
$P_i$ = incident power
$P_r$ = reflected power
$P_t$ = transmitted power
$n_1$ = reflective index of medium outside laser
$n_2$ = effective reflective index of laser material
$\theta_1$ = angle of emergence
$\theta_2$ = angle of incidence
$\theta_c$ = critical angle By varying the relative lengths of the three cavity portions 32, 34 and 36, and by also adjusting the angles of the facets 40 and 42, travelling waves of emitted light can be produced within the laser, with the waves striking the facet 44 at a predetermined angle less than the critical angle so as to select the desired proportion of light that will be transmitted through facet 44. Such selection requires, however, not only a careful design of the shape of the triangular travelling wave path but also a careful selection of the angles of facets 40 and 42 with respect to the facet 44. As indicated above, standard cleaving techniques for producing the facets surfaces 40 and 42 may not be available for producing the required angles of the facets with respect to the crystal structure of the laser material, so the laser has to be fabricated by an etching process, and is therefore compatible with monolithic integration. Accordingly, the facets 40, 42 and 44, as well as the entire shape of the body of the laser 30, are formed through a unique etching process which is illustrated in FIGS. 4A through 4D.

In accordance with the present invention, therefore, a monolithic laser body is produced in a nonrectangular shape to provide a path for propagation of a travelling wave. Although various laser structures may be used in such a device, in one example a graded index separate confinement heterostructure single quantum well laser structure was used. This laser structure was grown using the metalorganic chemical vapor deposition technique, and was produced in the following manner:

An n+ type Gallium Arsenide substrate 60 (see FIG. 4A) Si doped to a density of $2 \times 10^{18}$ cm$^{-3}$ was provided, onto which were grown a series of layers, starting with an n-GaAs buffer layer 62 which was 0.5 microns thick and doped to a density of $10^{18}$ cm$^{-3}$. This was followed by a buffer layer 64 of n-Al$_{0.15}$Ga$_{0.85}$As doped to a density of $10^{18}$ cm$^{-3}$ and which was 1.0 micron thick, an optical confinement layer 66 of n-Al$_{0.6}$Ga$_{0.4}$As doped to a density of $5 \times 10^{17}$ cm$^{-3}$ and which was 1.5 microns thick, an undoped linearly graded layer 68 of undoped Al$_x$Ga$_{1-x}$As (where x varies from 0.6 to 0.30) which was 0.2 microns thick, and a quantum well 70 consisting of a layer of undoped Al$_{0.06}$Ga$_{0.94}$As which was 122 Angstroms thick. These layers were followed, in order, by a layer 72 of undoped, linearly graded Al$_x$Ga$_{1-x}$As (where x=0.3 to 0.6) which was 0.2 microns thick, an optical confinement layer 74 of p-Al$_{0.6}$Ga$_{0.4}$As doped to a density of $10^{18}$ cm$^{-3}$ and having a thickness of 1.5 microns, and a cap 76 of p-GaAs doped to a density of $10^{19}$ cm$^{-3}$ and having a thickness of 0.1 microns. This block of laser material, generally indicated at 80 in FIGS. 4A–4D, formed a monolithic, generally rectangular wafer from which the laser device 30 was fabricated.

Figures 4A, 4B:
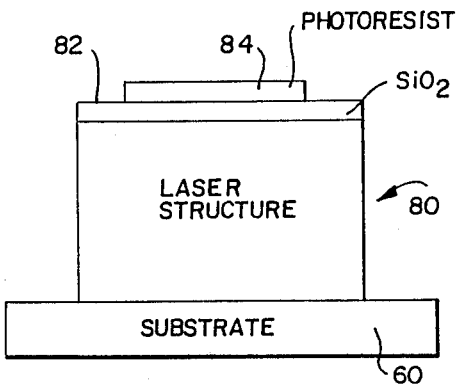

To form the laser 30 from the wafer 80, a plasma enhanced CVD silicon dioxide was deposited on the upper surface of the laser structure 80, as indicated in FIG. 4A by layer 82. This layer preferably is 6,000 to 7,000 Angstroms thick but depends on the depth of the etch required during the CAIBE step. Thereafter, a layer 84 of a conventional photoresist material was spun onto the surface of the silicon dioxide layer 82. This was followed by a layer 86 of contrast enhanced material (CEM) which was spun onto the top surface of the photoresist to provide better resolution in the lithographic step which is used to pattern the layer.

Figure 5:
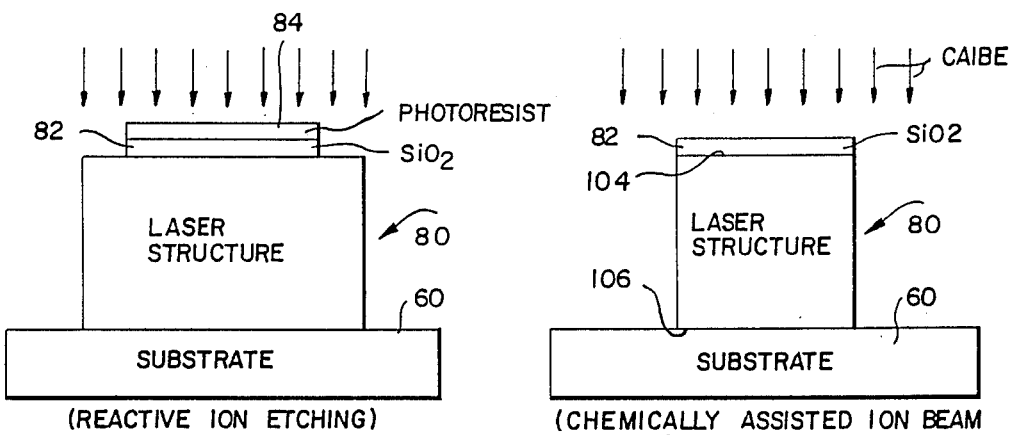
FIG. 5 is a diagrammatic plan view of the laser of FIG. 2, showing the path followed by stimulated emergence within the laser cavity and the emission of light from a selected facet.
Figure 5:
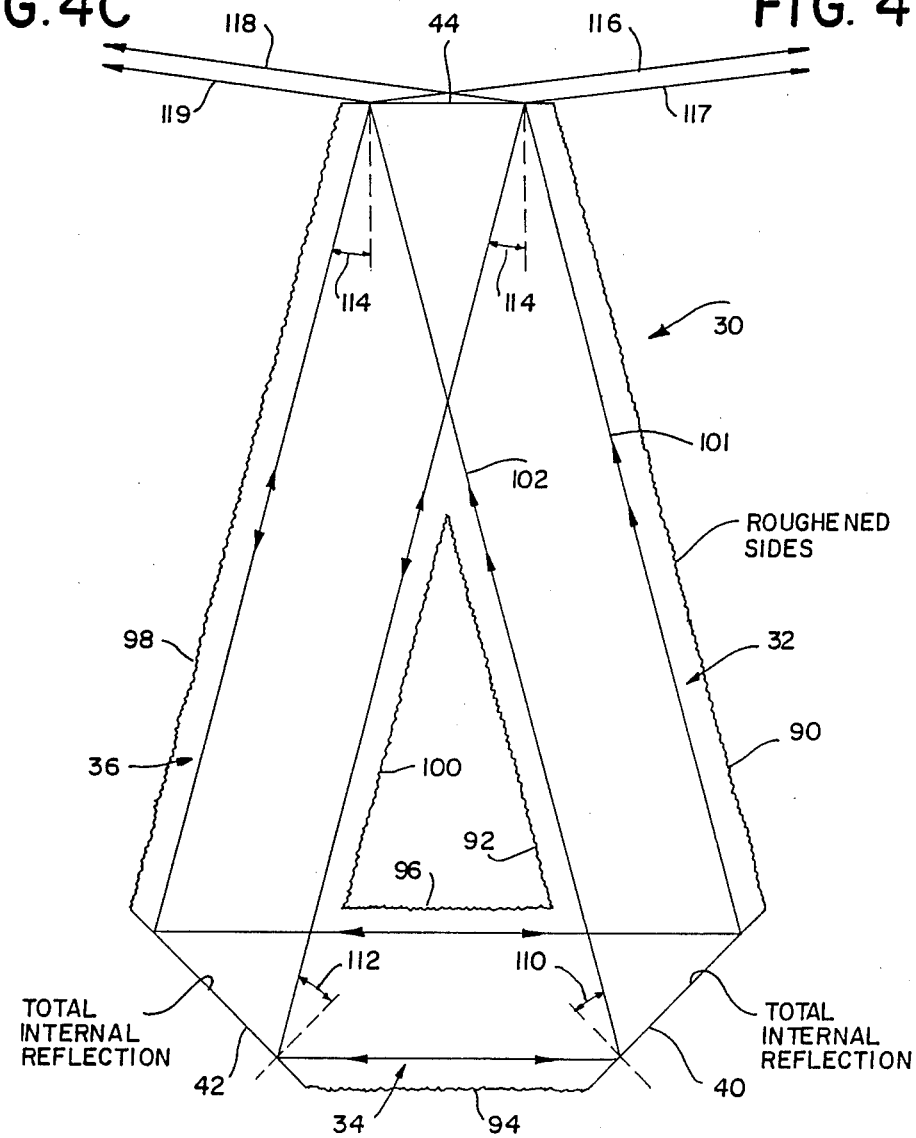

A mask in the shape of the laser body 30, illustrated in plan view in FIG. 5, was then used to pattern the photoresist material using standard photolithographic techniques. Thereafter, the CEM material 86 was chemically dissolved, and the photoresist material 84 was developed, to leave a photoresist mask on the silicon dioxide layer, as illustrated in FIG. 4B.

Reactive ion etching (RIE) was employed, utilizing CHF$_3$ to etch the silicon dioxide layer 82, as illustrated in FIG. 4C. The selectivity between the photoresist material 84 and the silicon dioxide during RIE is about 4. Low energy reactive ion etching was used to minimize heating of the photoresist material, thereby maintaining the vertical profile of the mask image.

The photoresist layer 84 was then completely removed through the use of a reactive ion etching step utilizing oxygen, and thereafter chemically assisted ion beam etching (CAIBE) was used to etch through the laser structure 80, as illustrated in FIG. 4D, following the pattern in the silicon dioxide layer. It is necessary to etch the laser shape past the active region and to such a depth as to allow laser oscillation to occur effectively. However, it may be preferred to etch just into the GaAs substrate 60 to enable placement of n-type metallization from the top surface to form the n contact. The laser structure produced by the steps of FIG. 4A through 4D is illustrated in FIG. 2 at 30, with the silicon dioxide pattern producing from a solid wafer of laser material the triangular device illustrated. The mask produced in the silicon dioxide is essentially the shape of the plan view of the device, illustrated in FIG. 5, and produces a zig-zag pattern along the walls 90 and 92 of segment 32, along the walls 94 and 96 of segment 34, and along walls 98 and 100 of segment 36. The zig-zag pattern produces roughened wall surfaces which prevent lateral oscillations within the laser body, and thus prevents laser action in the lateral direction. The CAIBE etching step produces vertical, smooth facets 40, 42 and 44 at the ends of the laser cavities, and it has been found that the smoothness and thus the reflectivity of these facets equals that of cleaved facets, thereby assuring proper laser operation.

After completion of the laser structure 30, a resist layer was then spun onto the top surface, and photolithography is used to produce a desired contact pattern for the top surface of the laser structure 30. After exposure of the resist, it was developed, and thereafter the silicon dioxide layer was removed from the opening in the photoresist, using buffered HF, thereby revealing the highly doped p-GaAs top surface 104 of the laser structure 30 for contacts formed by conventional metallization liftoff and subsequent connection of a bias source. The bottom surface of the laser structure is also connected to the bias source by way of the substrate 60, in conventional manner, or by placing contacts from the top by using conventional metallization liftoff techniques. However for the latter, one would have to at least etch to the layer 62 or further into the substrate 60.

As illustrated in the enlarged plan view of the triangular laser 30, shown in FIG. 5, light energy emitted within the body of the laser propagates along a closed, triangular path within the laser segments 32, 34 and 36. The propagating light energy is indicated by the arrows 101 and 102, and is produced by a bias voltage connected across the laser body; i.e. applied to the top surface 104 and the bottom surface 106 by way of suitable metallized contacts. The emitted light travels longitudinally through each of the three segments and is reflected by the facets 40, 42 and 44 at the ends of the segments so as to produce a continuous ring-type travelling wave laser. As indicated by the arrow heads on lines 101 and 102, emitted light may travel in either direction around the triangular laser body.

As previously discussed, facets 40 and 42 provide total internal reflection, since they are angled with respect to the cavity segments 32, 34 and 36 in such a way that emitted light incident on these two surfaces strikes the surfaces at angles greater than the critical angle; thus, angles 110 and 112 are greater than the critical angle of the respective surfaces 40 and 42. The length of cavity 34 is designed to ensure that propagating light energy which is reflected from surfaces 40 and 42 will strike facet 44 at an angle 114 which is less than the critical angle, thereby allowing a portion of the stimulated emission within the laser to emerge from the laser, as indicated by arrows 116 through 119. Accordingly, adjustment of the dimensions of the triangular laser 30 together with adjustment of the angles of the internally reflecting facets 40 and 42 provides a mechanism for controlling the angle of incidence on facet 44 of the propagating light thereby permitting control of the amount of light which emerges from surface 44 and thus controlling the threshold current required for achieving stimulated emission. The threshold current is defined as follows:

$$J_{th} \alpha \ (1/L) \ln(1/R) \tag{Eq. 4}$$

where $J_{th}$ is the threshold current density, L is the length of the laser cavity and R is the power reflectivity of the laser mirror. As R is increased, $J_{th}$ is decreased, so that the higher the reflectivity, the lower will be the threshold current required to produce lasing.

The foregoing technique can also be used to etch a variety of other shapes which can form lasers, as well as for etching other devices such as waveguide lenses or the like. In such devices, the etching technique can be used to form various angles which may be desired to achieve the desired optical features. When used in the fabrication of lasers, this provides another aspect of control for the laser so that laser operation can be optimized to provide the performance required for particular applications.

Thus, there has been illustrated a ring type laser having at least two internally reflecting facets and at least one partially transmitting facet which cooperate to produce travelling waves which strike the partially transmitting facet at an angle less than the critical angle to provide control over the threshold current of the device. The triangular laser is formed by an etching technique which permits accurate shaping of the laser and of the mirror facets to permit construction of lasers having features which are not available in structures in which the reflecting facets are formed by standard cleaving procedures. The etching process provides mirrors which are the full equivalent of cleaved mirrors, but has the advantage of permitting lasers to be constructed monolithically without the need for cleaving, and to permit shapes which could not be provided by the cleaving process. The technique can be applied to a variety of structures such as stripe or ridge lasers having narrow active areas, and further provides improved efficiency and controllability in laser devices. Although the invention has been shown in conjunction with the construction of a triangular laser, it will be understood that the etching technique can also be used with other shapes, including rectangular lasers, although the optimum configuration is triangular. Accordingly, it is desired that the true scope of the application be limited only by the following claims.

What is claimed is:

1. A ring-type laser comprising:
   a substrate;
   a monolithic laser body on said substrate and etched to form a laser structure, said laser structure including at least three longitudinal, integrally formed cavity sections with each section having first and second ends and an axis and each section defining a longitudinal light path along its axis, corresponding ends of said sections being integral to define at least three apexes at the intersections of the axes of adjoining sections, said axes intersecting at preselected angles to form a closed ring-type light path in the laser structure;
   current supply means connected across said laser structure for stimulating light emission within each said cavity section, whereby light propagates therein along light paths parallel to the axes of said cavity sections; and a facet integral with said laser structure at each of said apexes, each facet being positioned at its corresponding apex at preselected angles with the axes of adjoining sections to produce internal reflection of at least a part of said stimulated light propagating in said cavity sections to direct said light along said closed light path, said facets having a critical angle and each being positioned at a preselected angle with respect to the axes of adjacent cavity sections so as to cause at least a portion of said light propagating along said closed light path to impinge on each of said facets in turn, the angle between a line perpendicular to at least one of said facets and its adjacent cavity section axes being selected to be equal to or less than the critical angle thereof to thereby select the amount of light emitted by said laser.

2. The laser of claim 1, wherein said cavity sections are interconnected to define a triangular laser.

3. The laser of claim 1, wherein light propagating along said closed path impinges on said at least one facet at an incident angle which is less than the critical angle thereof and wherein light propagating along said closed path impinges on each of the remaining facets of said laser structure at an incident angle which is greater than the critical angle.

4. The laser of claim 2, wherein said facet means comprise smooth etched facets formed at preselected angles with respect to said cavity section light paths to direct light propagating in said triangular travelling wave path.

5. The laser of claim 4, wherein said preselected angles of said facets and the length of each of said cavity sections are selected to cause said light to impinge on each of said facets other than said at least one facet at incident angles which are greater than the critical angle of each respective facet.

6. The laser of claim 5, wherein said at least one facet partially transmits a predetermined portion of the light received at an incident angle less than said critical angle, and internally reflects the remainder of the incident light and wherein said laser structure includes second and third facets which are angled with respect to said light paths so that light propagating in said laser is incident on said second and third facets at angles greater than the critical angles thereof.

7. The laser of claim 5, wherein said at least one facet partially transmits a predetermined portion of the light received at an incident angle less than said critical angle, and internally reflects the remainder of the incident light and wherein said laser structure includes second and third facets which are angled with respect to said light paths so that light propagating in said laser is incident on said second and third facets at angles greater than the critical angles thereof; and means on each of said cavity sections for preventing lateral oscillations of light emissions stimulated therein.

8. The laser of claim 7, wherein said means for preventing lateral oscillations comprises roughened wall surfaces formed on said cavity sections.

9. The laser of claim 8, wherein said roughened wall surfaces include patterns formed thereon.

* * * * *